(12) United States Patent
Chi et al.

(10) Patent No.: US 8,729,645 B2
(45) Date of Patent: May 20, 2014

(54) SUBSTRATE BACKSIDE PEELING CONTROL

(71) Applicant: Taiwan Semiconductor Manufacturing Company, Ltd., Hsin-Chu (TW)

(72) Inventors: Liang-Chen Chi, Hsin-Chu (TW); Wei-Lun Jian, Hsin-Chu (TW); Chia-Ming Tsai, Zhubei (TW); Yu-Min Chang, Hsin-Chu (TW); Chin-Kun Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/722,426

(22) Filed: Dec. 20, 2012

(65) Prior Publication Data

US 2014/0061822 A1    Mar. 6, 2014

Related U.S. Application Data

(60) Provisional application No. 61/695,684, filed on Aug. 31, 2012.

(51) Int. Cl.
    *H01L 29/76*    (2006.01)

(52) U.S. Cl.
    USPC ............... 257/410; 257/411; 257/E29.162; 438/591; 438/216

(58) Field of Classification Search
    USPC ........... 257/410, 411, E29.162; 438/591, 216
    See application file for complete search history.

(56) References Cited

U.S. PATENT DOCUMENTS 7,095,040 B2 *   8/2006   Iwasaki et al. ............... 257/10

* cited by examiner

*Primary Examiner* — Tu-Tu Ho
(74) *Attorney, Agent, or Firm* — Slater & Matsil, L.L.P.

(57) ABSTRACT

Structures and methods for reducing backside polysilicon peeling are disclosed. A structure includes a substrate having a first side and a second opposite side, a first dielectric layer on the second side of the substrate extending in a direction from an edge of the substrate towards a center of the substrate, a high-k layer on the first dielectric layer, and a polysilicon layer on the high-k layer. The first dielectric layer has a first innermost sidewall relative to the center of the substrate, and the high-k layer has a second innermost sidewall relative to the center of the substrate. The second innermost sidewall is within 2 millimeters from the first innermost sidewall in a direction parallel to the second side. The polysilicon layer extends towards the center of the substrate further than the first innermost sidewall.

20 Claims, 4 Drawing Sheets

SUBSTRATE BACKSIDE PEELING CONTROL

This application claims the benefit of U.S. Provisional Patent Application Ser. No. 61/695,684, filed on Aug. 31, 2012, entitled "Substrate Backside Peeling Control," which application is hereby incorporated herein by reference in its entirety.

BACKGROUND

Semiconductor devices are used in a large number of electronic devices, such as computers, cell phones, and others. Semiconductor devices are included in integrated circuits that are formed on semiconductor wafers by depositing many types of thin films of material over the semiconductor wafers, and patterning the thin films of material to form the integrated circuits. Semiconductor devices include field-effect transistors (FETs) such as metal oxide semiconductor (MOS) transistors.

A large amount of attention is given to addressing the deposition and patterning of the films to form the semiconductor devices on one side of the wafer. These devices are the functional components of an integrated circuit, and the device functionality in turn determines the functionality of the integrated circuit. Various techniques are used to form different structures using various materials for many different applications.

A relatively small amount of attention is given to addressing a side of the wafer on which the semiconductor devices are not formed. Generally, these semiconductor devices are formed on only one side of a wafer, and what is formed on another side has no impact on the functioning of those semiconductor devices. However, as discussed in detail below, the inventors have discovered that failing to address problems on the side of the wafer that devices are not formed can lead to a lower yield.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
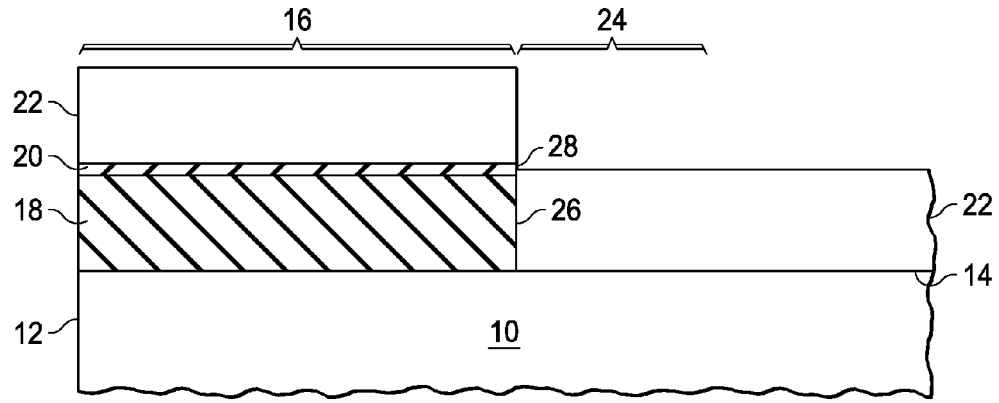
FIG. 1 is a film stack near an edge of a backside of a substrate according to an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments are described with respect to a semiconductor structure and to a processing method in which peeling of a backside layer material may be reduced. Specifically, embodiments are described with respect to a high-k layer and a polysilicon layer on the backside of a semiconductor substrate in which peeling of the polysilicon layer from the backside may be reduced. Other embodiments may also be applied, however, to other applications, using various materials and processing techniques.

Throughout the figures, like reference numerals refer to like components. Although method embodiments may be described in a particular order, other method embodiments may be performed in any logical order.

FIG. 1 illustrates a film stack region 16 near an edge 12 of a backside 14 of a substrate 10. Although the terms "backside" and "front side" may be used herein, these terms are used merely for convenience and may refer to opposite sides of a substrate, for example. Further, FIG. 1 is illustrated for clarity of features; in practice, the film stack region 16 may not be, for example, as uniform as illustrated. Even as a further example, although illustrated as a squared edge, in practice, the edge 12 and backside 14 may be rounded to some degree.

The substrate 10 in this embodiment is a semiconductor substrate and can be, for example, a bulk substrate, a semiconductor-on-insulator (SOI) substrate, a wafer, or the like. The substrate 10 can comprise any appropriate semiconductor material such as silicon, germanium, SiGe, SiC, GaAs, InP, or the like, doped in an appropriate manner or undoped. The illustrated portion of the substrate 10 can be, for example, approximately 3 millimeters measured from the edge 12 of the substrate 10 in a plane parallel to the backside 14. The film stack region 16 on the backside 14 comprises a first dielectric layer 18, a high-k layer 20, and a polysilicon layer 22. The first dielectric layer 18 can be, for example, a silicon nitride, silicon oxide, or the like and can be used as a mask for forming an isolation structure, such as a shallow trench isolation (STI), on the front side of the substrate 10. The first dielectric layer 18 can be deposited using atomic layer deposition (ALD), chemical vapor deposition (CVD) such as plasma enhanced CVD (PECVD), or the like. The high-k layer 20 can be, for example, oxides of metals, such as oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and mixtures thereof, for example $HfO_2$. The high-k layer 20 can be deposited using ALD, CVD, or the like. The polysilicon layer 22 can be deposited using CVD or the like, such as a batch process. The high-k layer 20 and polysilicon layer 22 can be used to form a gate stack, such as a gate dielectric and a gate electrode, for a device on the front side of the substrate 10. The film stack region 16 can be, for example, from the edge 12 to approximately 0.5 millimeters inward towards the center of the substrate 10 as measured in a plane parallel to the backside 14.

As a person having ordinary skill in the art would understand, the layers of the film stack region 16 are generally primarily used for forming devices and the like on the front side of the substrate 10. During some deposition processes to form these layers on the front side, the layers may also be formed on at least a portion of the backside 14. For example, batch type deposition processes may result in a layer being formed on both the front side and backside of the substrate 10. As another example, a substrate may rest on a substrate support, such as a plate, in a deposition chamber during a deposition process, and rounding of an edge may expose a periphery of the backside 14 of the substrate 10 to deposition gases. By this exposure, a layer can be deposited on the exposed periphery of the backside 14 along the edge 12. As a person having ordinary skill in the art will further understand, these layers may be patterned and/or removed from the front side of the substrate 10 in forming devices. A chemical mechanical polish (CMP) and/or anisotropic etch are typically used in patterning and/or removing these layers on the front side. With a CMP and/or an anisotropic etch, its corresponding directionality, and the wafer orientation usually required for the patterning and/or removal, the layers on the backside 14 are typically not affected by the CMP and/or etch and thus usually remain on the backside 14. In other processes such as an etch using an immersion in a solution, portions of materials on the backside 14 may be etched, but in some situations, one material may cover a portion of a layer preventing that portion of the layer from being etched. In some applications, these materials on the backside 14 generally do not affect the final integrated circuit functionality that is formed on the substrate 10 and are left on the backside 14 to avoid further processing costs to remove the layers. However, the present inventors have discovered that in some situations these layers can cause peeling of the polysilicon layer 22 from the backside 14 that can result in diminished yield.

FIG. 1 further illustrates a high stress region 24 on the backside 14 of the substrate 10. The high stress region 24 generally includes a transition of the polysilicon layer 22 from being on the first dielectric layer 18 to not being on the first dielectric layer 18. A stress, such as a high tensile stress, can be generated in the polysilicon layer 22 in the high stress region 24. The high stress region 24 extends from a sidewall 26 of the first dielectric layer 18 inward towards a center of the substrate 10 parallel to a surface of the backside 14. The high stress region 24 can have, for example, a range of approximately 0.5 millimeters to approximately 1.5 millimeters from the edge 12 of the substrate 10 measured in a plane parallel to the backside 14.

As depicted in FIG. 1, a sidewall 28 of the high-k layer 20 is aligned with the sidewall 26 of the first dielectric layer 18. In this embodiment, there is no portion of the high-k layer 20 in the high stress region 24. The inventors have discovered that an interface between the high-k layer 20 and the polysilicon layer 22 can be weak, and that having such an interface in the high stress region 24 can lead to peeling of the polysilicon layer 22 from the backside 14 of the substrate 10. Accordingly, embodiments seek to minimize or control the amount of high-k layer 20 that is formed in the high stress region 24.

Figure 2A:
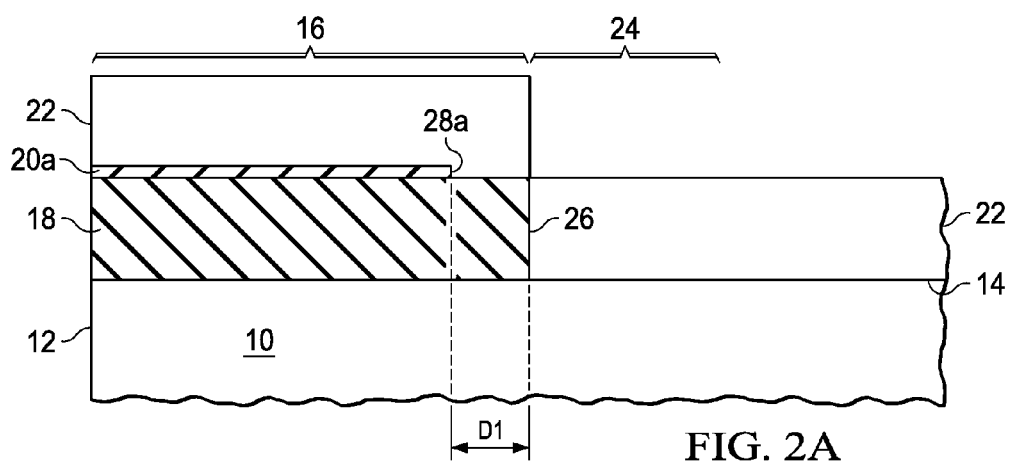
FIG. 2A is a film stack near an edge of a backside of a substrate according to another embodiment.
Figure 2B:
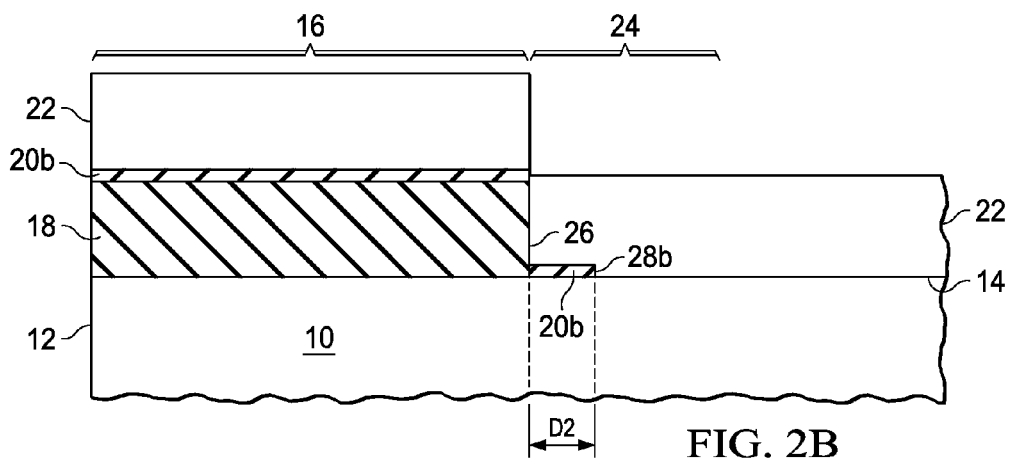
FIG. 2B is a film stack near an edge of a backside of a substrate according to a further embodiment.

Although FIG. 1 depicts an embodiment where the sidewall 28 of the high-k layer 20 aligns with the sidewall 26 of the first dielectric layer 18, other embodiments contemplate that the sidewalls 26 and 28 do not align. For example, in FIG. 2A, the high-k layer 20a extends from the edge 12 and terminates at the sidewall 28a a distance D1 before reaching the sidewall 26 of the first dielectric layer 18. In FIG. 2B, the high-k layer 20b extends from the edge 12 to the sidewall 26 of the first dielectric layer 18 and into the high-stress region 24 a distance D2 before terminating at the sidewall 28b, a sidewall innermost to a center of the substrate 10. The distance D1 can be less than 1 millimeter, and the distance D2 can be less than 2 millimeter.

Figure 3A:
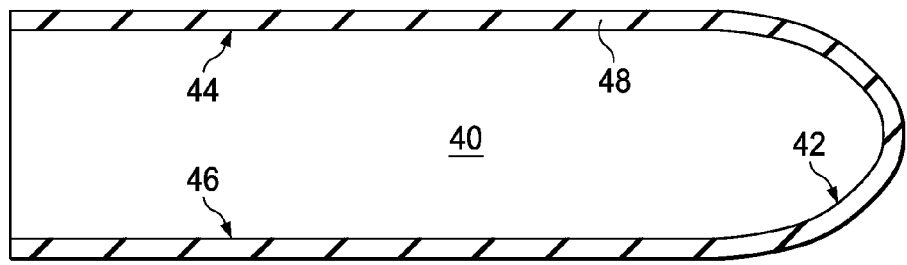
FIGS. 3A through 3G are a method of semiconductor processing where backside polysilicon peeling can be reduced according to an embodiment.

FIGS. 3A through 3G illustrate a method of semiconductor processing where backside polysilicon peeling can be reduced. FIG. 3A illustrates the formation of a first dielectric layer 48 on the substrate 40. The substrate 40 can be the same or similar as the substrate 10 in FIG. 1. As mentioned previously, in practice, edge 42 of the substrate 40 is generally rounded, for example, as a result of producing the substrate 40. As is readily apparent to a person having ordinary skill in the art, the substrate 40 may have doped wells, such as p-type or n-type wells, formed by ion implantation through a front side 44 of the substrate 40 before the formation of the first dielectric layer 48. The doped wells may be used in devices that are formed by the processing. FIG. 3A also illustrates a backside 46 of the substrate 40. It should also be noted that edge 42 circumscribes the substrate 40, which may be a circular wafer, although not expressly shown in the figures.

The first dielectric layer 48 is deposited using a differential batch processing technique, which can be ALD, CVD, or the like in a deposition chamber. In such a batch processing technique, the first dielectric layer 48 is deposited on the front side 44, backside 46, and edge 42 of the substrate 40. The first dielectric layer 48 can be, for example, a silicon nitride, silicon oxide, or the like, and in this example, the first dielectric layer 48 is a silicon nitride.

Figure 3B:
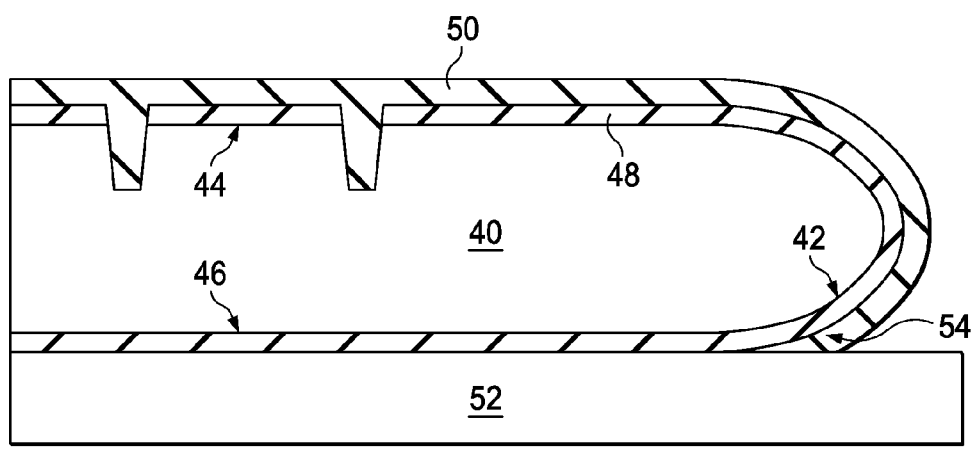

In subsequent processing steps, the substrate 40 can be removed from the deposition chamber, and various photolithography steps can be performed on the substrate 40. For example, a photoresist can be formed and patterned over the first dielectric layer 48 on the front side 44. The pattern of the photoresist can be transferred to the first dielectric layer 48 using, for example, an anisotropic etch. The first dielectric layer 48 can then be used as a mask used in etching trenches in the front side 44 of the substrate 40 for an isolation structure, such as an STI. After the etch, as shown in FIG. 3B, an isolation material 50 can be formed in the trench and over exposed areas of the first dielectric layer 48. The isolation material 50 can be formed by a deposition technique, such as by CVD, or the like. During a CVD deposition, the substrate 40 is supported by a first substrate support 52, such as a plate. As a result of the rounded edge 42 of the substrate 40, a gap 54 is formed between the backside 46 of the substrate 40 and the first substrate support 52. This gap 54 exposes a periphery portion of the backside 46, such as a portion of the first dielectric layer 48, and allows the isolation material 50 to be formed in this gap 54 and on the exposed surface of the first dielectric layer 48 in this gap 54. However, the first substrate support 52 may prevent the isolation material 50 from being formed further on the backside 46 of the substrate 40.

Figure 3C:
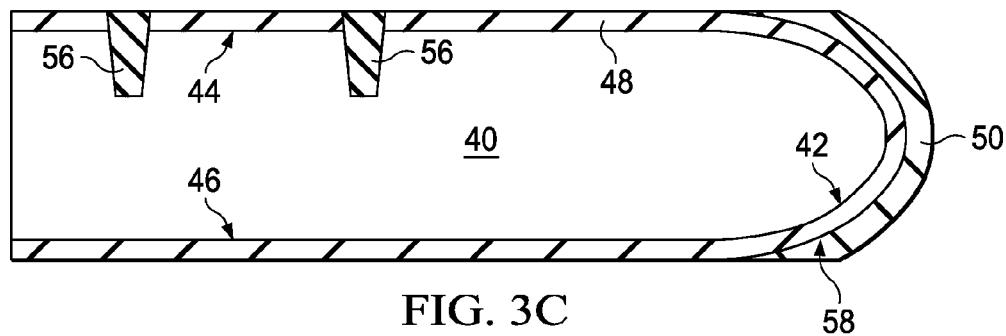

In FIG. 3C, excess isolation material 50 on the front side 44 of the substrate 40 is removed, for example, by a CMP. This forms isolation regions 56, such as STIs, in the front side 44 of the substrate 40. After this removal, isolation material 50 remains on the rounded edge 42 of the substrate 40, particularly portion 58 on the backside 46 corresponding to where the gap 54 was during formation of the isolation material 50.

Figure 3D:
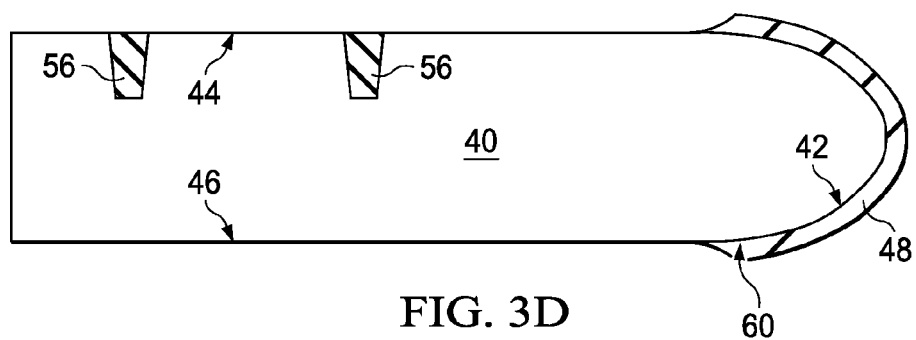

FIG. 3D illustrates the structure in FIG. 3C after an etch to remove portions of the first dielectric layer 48. The etch may include immersing the substrate 40 in a solution, such as a solution comprising sulfuric acid. The remaining portion of the isolation material 50 in FIG. 3C may generally prevent a portion of the first dielectric layer 48 on the rounded edge 42 of the substrate 40 from being etched and removed. Thus, a portion of the first dielectric layer 48 may remain on the rounded edge 42, such as a portion 60 corresponding to the gap 54 between the backside 46 and the substrate support 52, as shown in FIG. 3D. Other portions of the first dielectric layer 48 on the front side 44 and the back side 46 may be etched and removed.

Figure 3E:
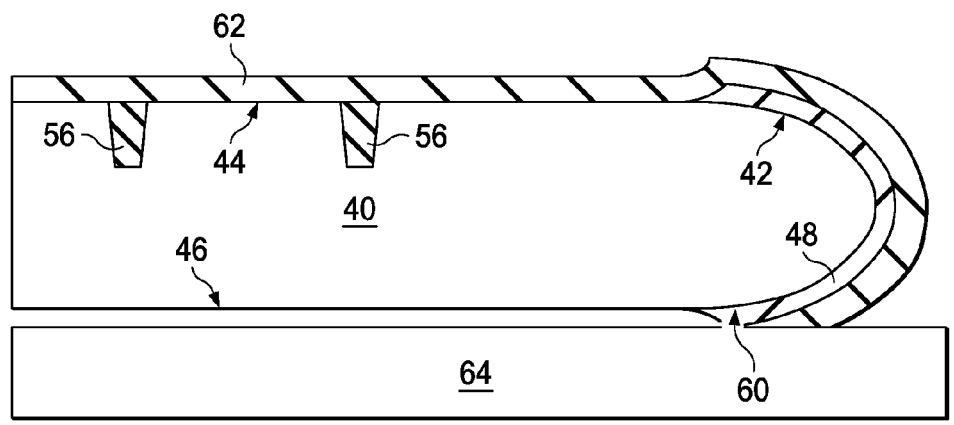

FIG. 3E further illustrates the formation of a high-k layer 62 on the substrate 40. The high-k layer 62 can be the same as or similar to the high-k layer 20 in FIG. 1. The high-k layer 62 can be deposited using ALD or the like. During this deposition, the substrate 40 is on a second substrate support 64, such as a plate, in a second deposition chamber. During this deposition, the second substrate support 64 generally contacts and tightly joins to the portion 60 of the first dielectric layer 48 on the backside 46 of the substrate 40. The high-k layer 62 is deposited on exposed surfaces, such as surfaces of the substrate 40 and the first dielectric layer 48. If the second substrate support 64 contacts and tightly joins the portion 60, the high-k layer 62 may not be deposited on the backside 46 of the substrate 40 because gases used for the deposition may not be able to enter the pocket formed between the backside 46, the second substrate support 64, and the portion 60.

The portion 60 of the first dielectric layer 48 may generally contact and be tightly joined by maintaining substrate supports, such as the first substrate support 52 and the second substrate support 64 in this described process, with a smooth and/or level surface that contacts the portion 60. The substrate supports can be periodically polished, such as by a CMP, to maintain a smooth surface. Residues from various processes can build up on a substrate support thereby resulting in an uneven surface. An uneven surface may result in gases coming in contact with the backside 46 of the substrate 40 and depositing a material on the backside 46. By polishing the substrate supports, a smooth, flat surface can be achieved to allow portion 60 to generally contact and tightly join the second substrate support 64, for example. The substrate supports can be polished after every deposition process or during every routine periodic maintenance, for example. Further, the substrate supports can have the surface smoothed to a surface roughness less than about 0.02 millimeters RMS.

Figure 3F:
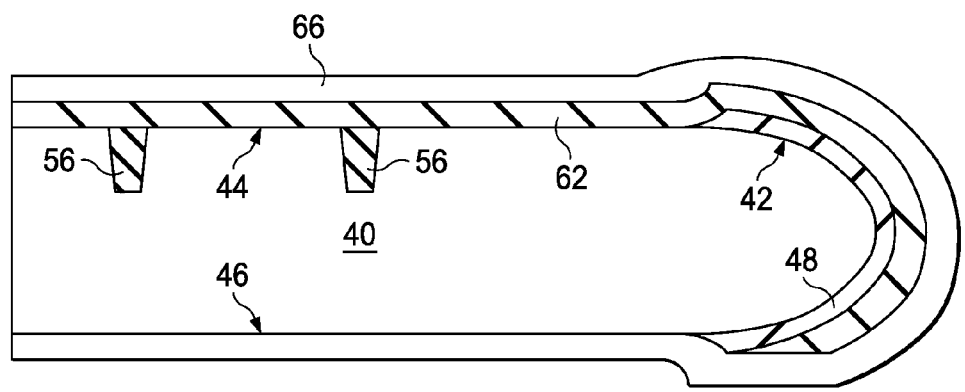

In FIG. 3F, a polysilicon layer 66 is formed on the substrate 40. The polysilicon layer 66 can be formed using CVD or the like, for example, using a differential batch-type process in a deposition chamber. In such a batch processing technique, the polysilicon layer 66 is formed on the front side 44, backside 46, and edge 42 of the substrate 40.

Figure 3G:
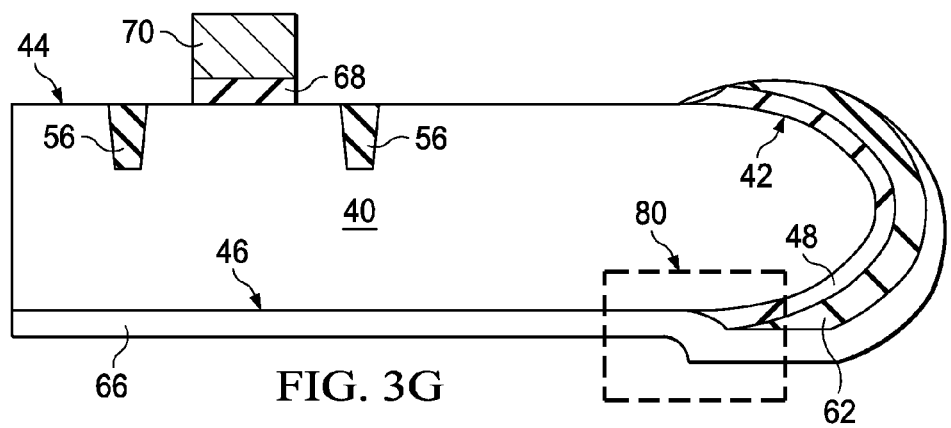

FIG. 3G illustrates the structure after further processing. In FIG. 3G, the polysilicon layer 66 and high-k layer 62 are patterned into a gate stack on the front side 44 of the substrate 40, such as by an anisotropic etch. The gate stack comprises a gate electrode 70 and a gate dielectric 68, where the polysilicon layer 66 is the gate electrode 70 and the high-k layer 62 is the gate dielectric 68. A person having ordinary skill in the art will readily understand other processing that may occur to form a device, such as a transistor. For example, gate spacers can be formed along the sidewalls of the gate stacks, source/drain regions can be formed in the front side 44 of the substrate 40 by implanting dopants into the substrate 40, and various interlayer dielectric (ILD) and intermetal dielectric (IMD) layers with various contacts and interconnect structures can be formed on the front side 44 of the substrate 40.

For clarity, dashed box 80 in FIG. 3G generally corresponds to the simplified structure in FIG. 1. For example, substrate 10, first dielectric layer 18, high-k layer 20, and polysilicon layer 22 of FIG. 1 generally correspond to substrate 40, first dielectric layer 48, high-k layer 62, and polysilicon layer 66, respectively, in FIG. 3G. Discussion of features with respect to either of these structures may be relevant to features of the other structure.

As described in embodiments above, an amount of the high-k layer 20 may be minimized and/or formation of such high-k layer 20 may be prevented in a high stress region 24 on the backside 14 of a substrate 10. By minimizing the amount and/or preventing formation of the high-k layer 20 in this high stress region 24, an interface between the high-k layer 20 and the polysilicon layer 22 in the high stress region 24 is minimized and/or prevented. The inventors have discovered that by having an interface between the high-k layer 20 and the polysilicon layer 22 in the high stress region 24, peeling of the polysilicon layer 22 from the backside 14 can occur as a result of weak adhesion between the polysilicon layer 22 and the high-k layer 20 and as a result of the intrinsic stress on that weak adhesion. This peeling can have adverse effects on a photolithography focus, a CMP, and a metal residue during later processing. By minimizing and/or preventing such an interface in the high stress region 24, peeling of the polysilicon layer 22 from the backside 14 can be reduced, thereby avoiding the adverse effects of such peeling. The inventors have discovered that a peeling count decreases from 18.9 per substrate to substantially 0 per substrate when changing from previous processing to processing according to an embodiment. Further, additional advantages have been achieved using various embodiments compared to previous processing.

An embodiment is a structure comprising a substrate, a first dielectric layer, a high-k layer, and a polysilicon layer. The substrate has a first side and a second side, and the second side is opposite the first side. A device is on the first side. The first dielectric layer is on the second side of the substrate and extends in a direction from an edge of the substrate towards a center of the substrate parallel to the second side. The first dielectric layer has a first innermost sidewall relative to the center of the substrate. The high-k layer is on the first dielectric layer, and the high-k layer has a second innermost sidewall relative to the center of the substrate. The second innermost sidewall is within 2 millimeters of the first innermost sidewall in a direction parallel to the second side. The polysilicon layer is on the high-k layer, and the polysilicon layer extends towards the center of the substrate further than the first innermost sidewall.

Another embodiment is a structure including a substrate, a film stack, and a polysilicon layer. The substrate has a first side and a second side, and the second side is opposite the first side. A device is on the first side. The film stack is along a periphery of the second side of the substrate and comprises a first dielectric layer and a high-k layer over the first dielectric layer. An innermost sidewall of the high-k layer is less than 2 millimeters from an innermost sidewall of the first dielectric layer measured in a direction parallel to the second side. The innermost sidewall of the high-k layer and the innermost sidewall of the first dielectric are relative to a center of the substrate and away from an edge of the substrate. The polysilicon layer is over the film stack and adjoins a portion of the innermost sidewall of the first dielectric layer.

A further embodiment is a method comprising forming a first dielectric layer on a substrate, the first dielectric layer being on a first side of the substrate and on a second side of the substrate, the second side being opposite the first side; removing portions of the first dielectric layer, a periphery portion of the first dielectric layer remaining on a periphery portion of the second side after the removing; forming a high-k layer on the first side and on the periphery portion of the first dielectric layer on the periphery portion of the second side while the substrate is on a substrate support, the high-k layer not being formed beyond 2 millimeters from a sidewall of the periphery portion of the first dielectric layer on the second side of the substrate in a direction towards a center of the substrate; and forming a polysilicon layer on the high-k layer and the second side of the substrate, wherein a device is formed on the first side of the substrate.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
a substrate having a first side and a second side, the second side being opposite the first side, a device being on the first side;
a first dielectric layer on the second side of the substrate, the first dielectric layer extending in a direction from an edge of the substrate towards a center of the substrate parallel to the second side, the first dielectric layer having a first innermost sidewall relative to the center of the substrate;
a high-k layer on the first dielectric layer, the high-k layer having a second innermost sidewall relative to the center of the substrate, the second innermost sidewall being within 2 millimeters of the first innermost sidewall in a direction parallel to the second side; and
a polysilicon layer on the high-k layer, the polysilicon layer extending towards the center of the substrate further than the first innermost sidewall.

2. The structure of claim 1, wherein the first innermost sidewall and the second innermost sidewall are aligned in a direction perpendicular to the second side of the substrate.

3. The structure of claim 1, wherein the second innermost sidewall is closer to the center of the substrate than the first innermost sidewall.

4. The structure of claim 1, wherein the first innermost sidewall is closer to the center of the substrate than the second innermost sidewall.

5. The structure of claim 1, wherein the first dielectric layer comprises silicon nitride.

6. The structure of claim 1, wherein the high-k layer comprises hafnium oxide.

7. The structure of claim 1, wherein the polysilicon layer comprises a high stress region, the high stress region being proximate the first innermost sidewall and extending a distance towards the center of the substrate.

8. A structure comprising:
a substrate having a first side and a second side, the second side being opposite the first side, a device being on the first side;
a film stack along a periphery of the second side of the substrate, the film stack comprising:
a first dielectric layer, and
a high-k layer over the first dielectric layer, an innermost sidewall of the high-k layer being less than 2 millimeters from an innermost sidewall of the first dielectric layer measured in a direction parallel to the second side, the innermost sidewall of the high-k layer and the innermost sidewall of the first dielectric being relative to a center of the substrate and away from an edge of the substrate; and
a polysilicon layer over the film stack and adjoining a portion of the innermost sidewall of the first dielectric layer.

9. The structure of claim 8, wherein the innermost sidewall of the high-k layer and the innermost sidewall of the first dielectric layer are aligned in a direction perpendicular to the second side of the substrate.

10. The structure of claim 8, wherein the innermost sidewall of the high-k layer is nearer to the center of the substrate than the innermost sidewall of the first dielectric layer.

11. The structure of claim 8, wherein the innermost sidewall of the first dielectric layer is nearer to the center of the substrate than the innermost sidewall of the high-k layer.

12. The structure of claim 8, wherein the first dielectric layer comprises silicon nitride, and the high-k layer comprises hafnium oxide.

13. The structure of claim 8, wherein the polysilicon layer comprises a high stress region, the high stress region extending from the innermost sidewall of the first dielectric layer towards the center of the substrate.

14. A method comprising:
forming a first dielectric layer on a substrate, the first dielectric layer being on a first side of the substrate and on a second side of the substrate, the second side being opposite the first side;
removing portions of the first dielectric layer, a periphery portion of the first dielectric layer remaining on a periphery portion of the second side after the removing;
forming a high-k layer on the first side and on the periphery portion of the first dielectric layer on the periphery portion of the second side while the substrate is on a substrate support, the high-k layer not being formed beyond 2 millimeters from a sidewall of the periphery portion of the first dielectric layer on the second side of the substrate in a direction towards a center of the substrate; and
forming a polysilicon layer on the high-k layer and the second side of the substrate,
wherein a device is formed on the first side of the substrate.

15. The method of claim 14 further comprising maintaining the substrate support with a surface roughness less than 0.02 millimeters RMS.

16. The method of claim 14, wherein the substrate support and contacts the periphery portion of the first dielectric layer during the forming the high-k layer such that gases used during the forming the high-k layer are prevented from penetrating between the periphery portion and the substrate support.

17. The method of claim 14, wherein an innermost sidewall of the periphery portion of the first dielectric layer and an innermost sidewall of the high-k layer are aligned in a direction perpendicular to the second side of the substrate, the innermost sidewall of the periphery portion of the first dielectric layer and the innermost sidewall of the high-k layer being innermost sidewalls away from an edge of the substrate.

18. The method of claim 14, wherein the polysilicon layer includes a high stress region proximate the portion of the first dielectric layer.

19. The method of claim 14, wherein the first dielectric layer comprises silicon nitride.

20. The method of claim 14, wherein the high-k layer comprises hafnium oxide.

* * * * *